United States Patent [19]

Jelks et al.

[11] 4,409,262
[45] Oct. 11, 1983

[54] FABRICATION OF SUBMICRON-WIDE LINES WITH SHADOW DEPOSITIONS

[75] Inventors: Edward C. Jelks, Dallas, Tex.; George L. Kerber, San Diego, Calif.

[73] Assignee: The United States of America as represented by the Secretary of the Navy, Washington, D.C.

[21] Appl. No.: 344,341

[22] Filed: Feb. 1, 1982

[51] Int. Cl.³ .............................................. B05D 5/12
[52] U.S. Cl. ..................................... 427/99; 427/124; 427/250; 427/255.7; 427/63
[58] Field of Search .................. 427/63, 99, 250, 124, 427/255.7

[56] References Cited

U.S. PATENT DOCUMENTS 3,898,353  8/1975  Napoli et al. ....................... 427/250
4,256,816  3/1981  Dunkleberger ...................... 430/324

OTHER PUBLICATIONS

Jelks et al., Appl. Phys. Lett. 34(1), Jan. 1, 1979, p. 28.
Jackel et al., IEEE Transactions on Magnetics, vol. 17, No. 1, Jan. 1981, p. 295.
Howard et al., Appl. Phys. Lett., 35(11), Dec. 1, 1979, p. 879.
Hu et al., IEEE Transactions on Electron Devices, vol. Ed. 27, No. 10, p. 2030, Oct. 1980.

Havemann, J. Vac. Sci. Technol. vol. 15, No. 2, Mar.-/Apr. 1978, p. 389.

*Primary Examiner*—Michael R. Lusignan
*Assistant Examiner*—Richard Buekes
*Attorney, Agent, or Firm*—Robert F. Beers; Ervin F. Johnston; John Stan

[57] ABSTRACT

A method of fabricating lines of submicron width, comprising the steps of:
providing a substrate,
depositing a first layer of metal upon the substrate;
spinning a photoresist layer on the metal;
patterning the photoresist layer;
etching the metal to undercut the photoresist edge, e.g. with a mixture for approximately ten minutes at room temperature;
depositing a second layer of metal at an angle $\theta_1$ to the photoresist edge, thereby defining a long, submicron-wide opening to the underlying substrate;
depositing a chosen material, for example, metallic or semiconductor, for the bridge onto the substrate at an angle of $\theta_2$ through the submicron-wide opening; and
removing undesired material surrounding the bridge by dissolving the photoresist in hot acetone followed by stripping the remaining two layers of metal with etchant.

1 Claim, 11 Drawing Figures

SHADOW DEPOSITION GEOMETRY.

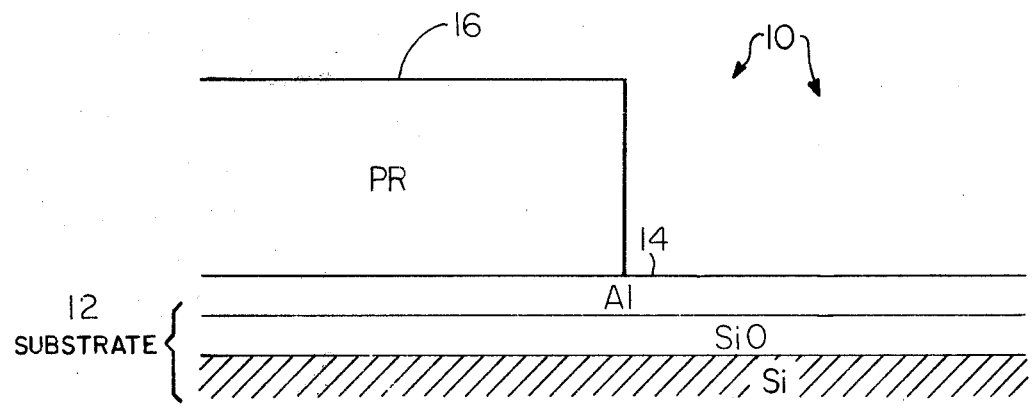
FIG. 1A. INITIAL PREPARATION OF SUBSTRATE.
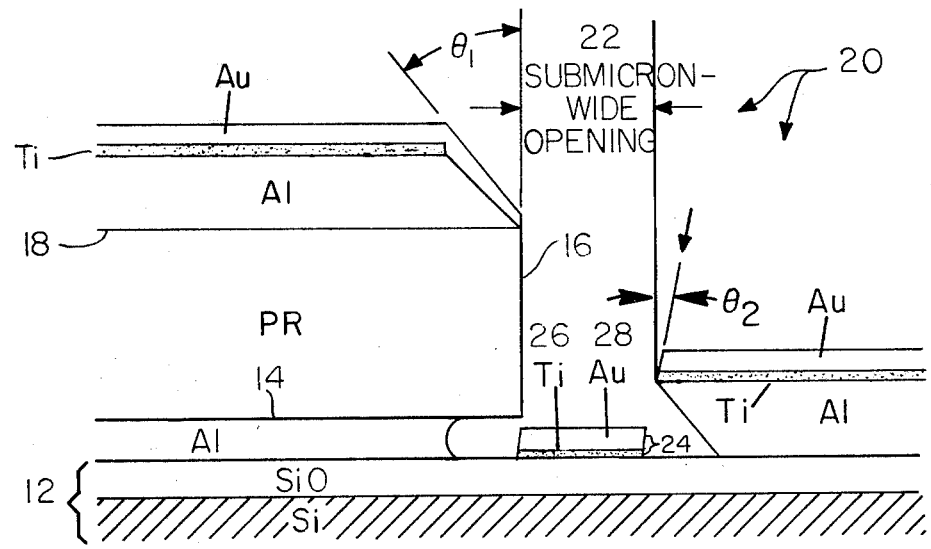
FIG. 1B. SHADOW DEPOSITION GEOMETRY.
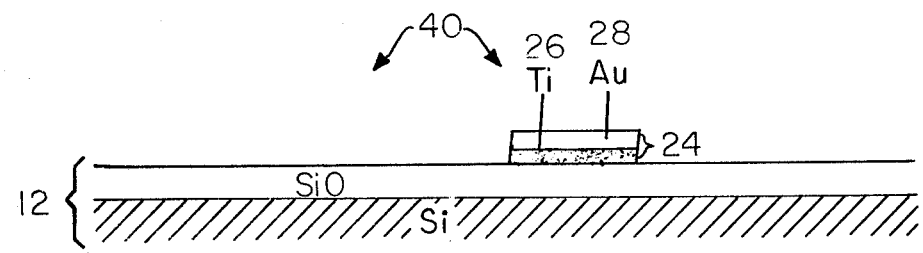
FIG. 1C. FINAL CONFIGURATION.
FIG. 1. FABRICATION SEQUENCE FOR SUBMICRON LINES

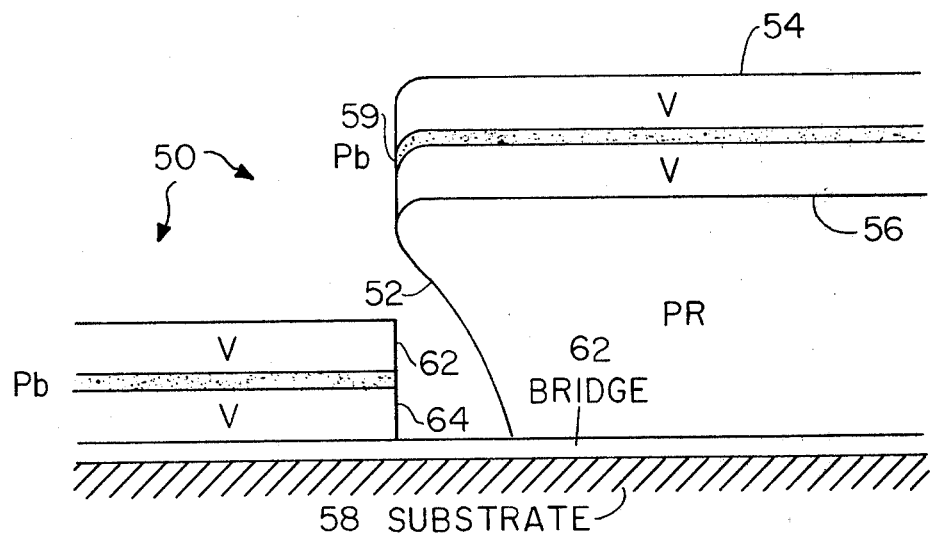
FIG. 2A. PATTERNING OF FIRST BANK.
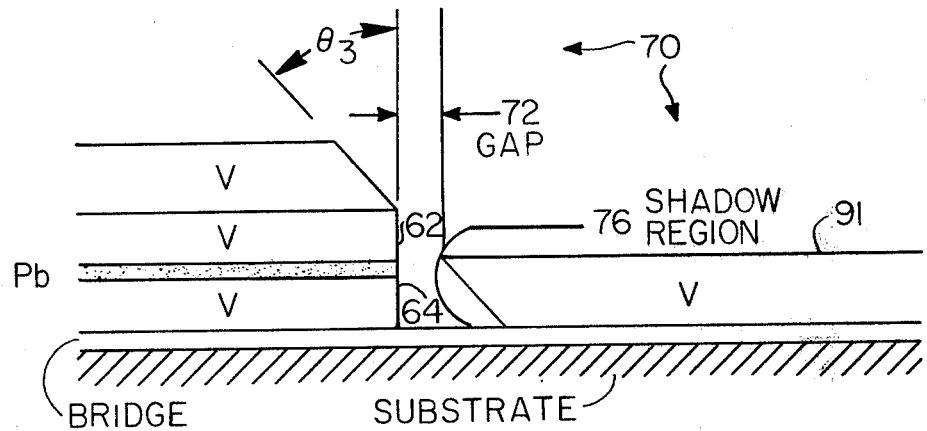
FIG. 2B. DEPOSITION OF SECOND BANK.
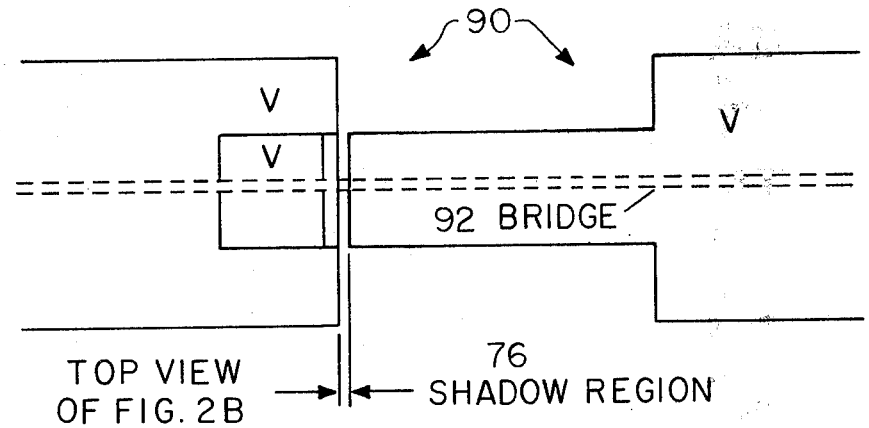
FIG. 2C. COMPLETED DEVICE (REDUCED SCALE)
FIG. 2. FABRICATION SEQUENCE FOR BANKS.

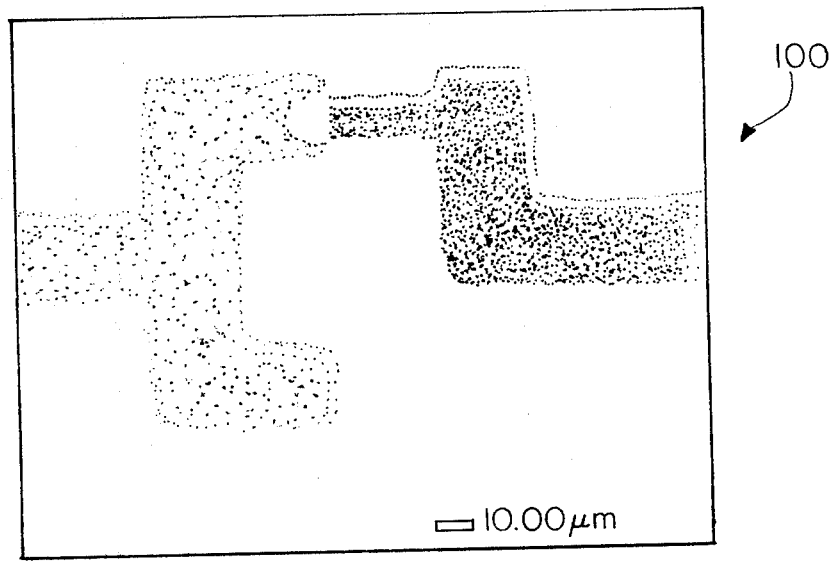
NOTES: 25 KV
X 600
FIG. 3A. OVERALL VIEW OF DEVICE.
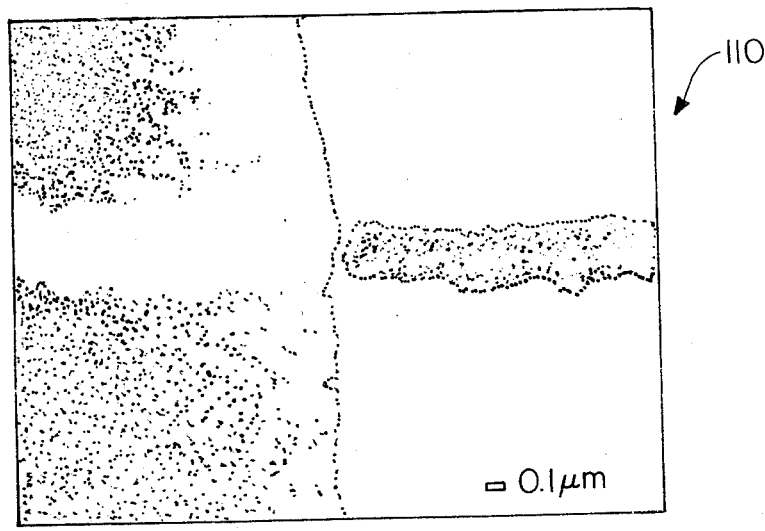
NOTES: 25 KV
X 40,000
FIG. 3B. CLOSEUP OF GAP REGION.
FIG. 3. SCANNING ELECTRON MICROSCOPE
PICTURES OF A SINGLE MICROBRIDGE.

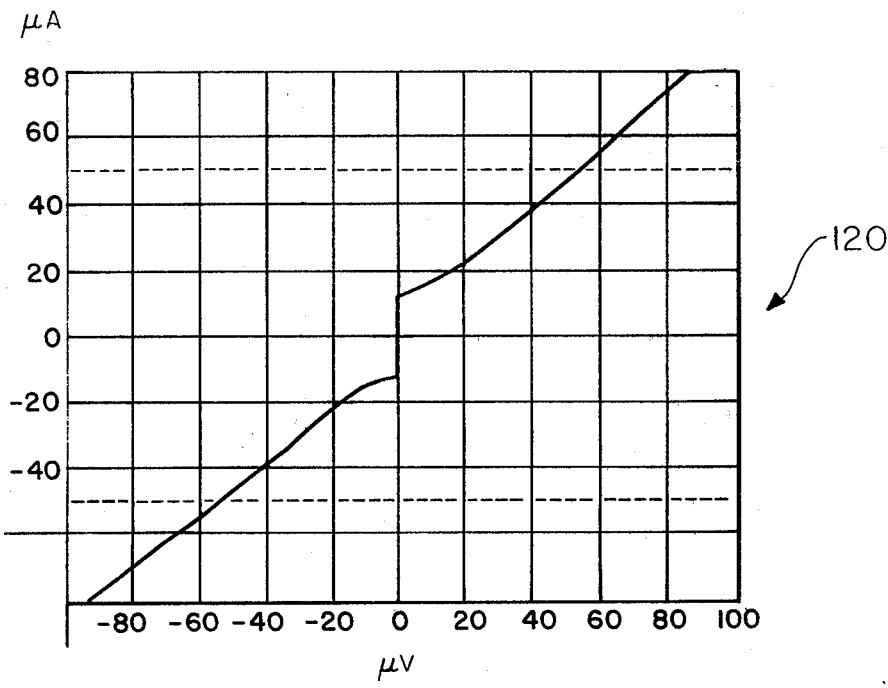
FIG. 4A. SINGLE MICROBRIDGE WITH NO APPLIED FIELDS.
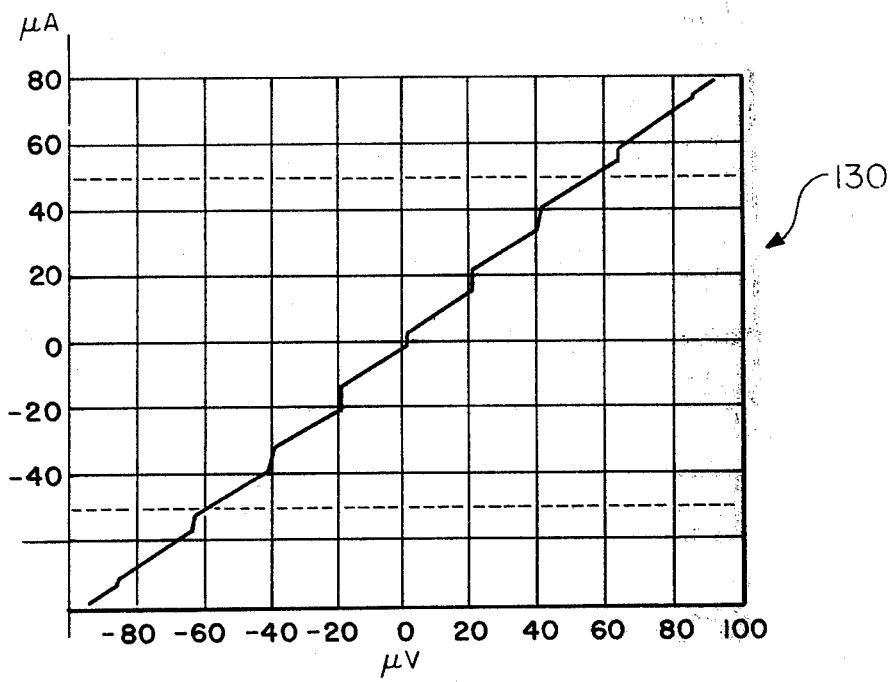
FIG. 4B. SINGLE MICROBRIDGE WITH 10 GHz RADIATION PRESENT.

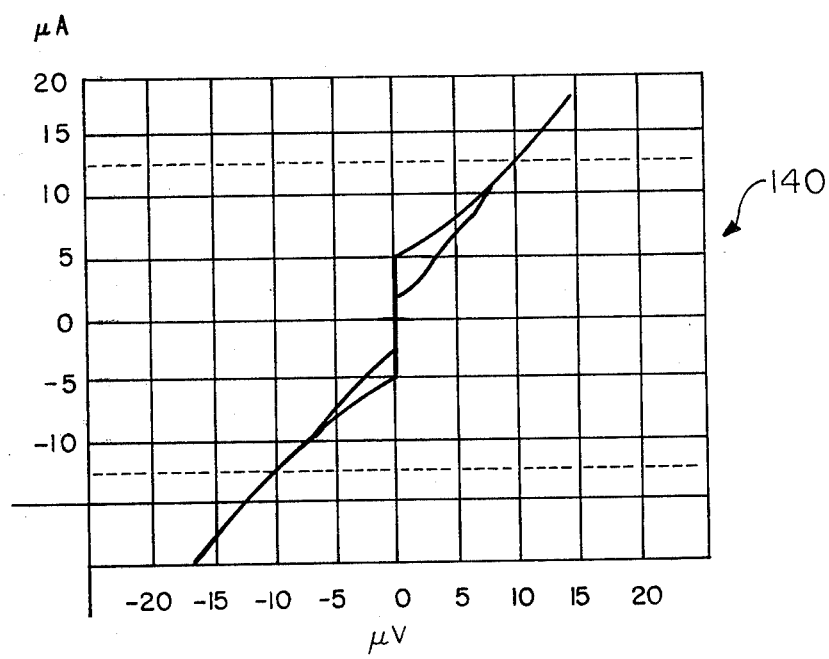
FIG. 4C. DOUBLE DEVICE SUBJECTED TO TWO DIFFERENT MAGNETIC FIELD INTENSITIES.
FIG. 4. CURRENT VOLTAGE CHARACTERISTICS OF TYPICAL MICROBRIDGES.

FABRICATION OF SUBMICRON-WIDE LINES WITH SHADOW DEPOSITIONS

STATEMENT OF GOVERNMENT INTEREST

The invention described herein may be manufactured and used by or for the Government of the United States of America for governmental purposes without the payment of any royalties thereon or therefor.

CROSS REFERENCE TO RELATED APPLICATIONS

This application is related to a co-pending patent application by Edward C. Jelks, George L. Kerber, and Howard A. Wilcox, entitled "An Optical Lithographic Technique For Fabricating Submicron-Sized Josephson Micro-Bridges," U.S. patent office Ser. No. 230,246.

BACKGROUND OF THE INVENTION

1. Field of the Invention

This invention relates to a method for fabricating planar micro-bridges and SQUIDs.

2. Description of the Prior Art

Methods used in the prior art to fabricate submicron-wide lines, such as electron beam and X-ray lithography, are generally limited to practical dimensions of about 0.2 to 0.3 microns (1 micron = $10^{-6}$ meters). These techniques are costly and difficult to implement. If atoms are evaporated at angles to thin film edges, submicron features can be defined with dimensions of 0.2 micron or less, and this only requires the use of conventional optical masks to define the thin-film edges.

Previous shadowing techniques are tedious to use, however, and are often difficult to control. These prior art methods are described in detail in U.S. Pat. No. 3,898,353, to L. S. Napoli et al., entitled SELF ALIGNED DRAIN AND GATE FIELD EFFECT TRANSISTOR, which issued on Aug. 5, 1975; another description of this prior art method appears in the Applied Physics Letters, January 1979, under the title "A Simple Method for Fabricating Lines of 0.15 Micron With Using Optical Lithography".

A disadvantage with prior art methods is that some require etching subsequent to the shadow deposition, thus, (a) degrading the correlation between opposite sides of the shadow regions, (b) requiring etching out a cavity underneath the submicron shadow region, which is extremely hard to control and observe, and (c) requiring the use of an etch-resistant material for the shadowing deposition, thus making it very difficult to remove later. The invention hereindescribed addresses these prior art problems with a new shadowing technique.

SUMMARY OF THE INVENTION

A method of fabricating lines of submicron width, comprising the steps of: (1) providing a substrate, for example, of silicon-monoxide/silicon; (2) depositing a layer of metal, such as aluminum, approximately 1000 Å thick upon the substrate; (3) spinning a photoresist layer, such as Shipley 1350B, onto the metal; (4) patterning the photoresist layer; (5) etching the metal to undercut the photoresist edge, for example, with a mixture of two parts phosphoric acid, one part acetic acid and one part deionized water, for about ten minutes at room temperature; (6) depositing a layer of metal, such as aluminum, at an angle $\theta_1$, to the photoresist edge, thereby defining a long, submicron-wide, opening to the underlying substrate; (7) depositing a chosen material for the bridge at an angle of $\theta_2$ through the submicron-wide opening; and (8) removing undesired material surrounding the bridge by dissolving the photoresist in hot acetone followed by stripping the remaining aluminum layers with etchant.

The layer mentioned in step (3) is made by Shipley Company Inc., 2300 Washington St., Newton, MA 02162.

OBJECTS OF THE INVENTION

An object of the invention is to provide a method of fabricating submicron wide lines using shadow depositions.

Another object of the invention is to provide a method wherein all critical chemical etching is performed before the shadowing depositions are done.

No etch-resistant material need be deposited at angle $\theta_1$ to protect the aluminum layer. The etch-resistant materials are often of high melting point and thus tend to cause distortion of the photoresist (PR) during deposition. Also the etch-resistant materials are hard to remove later without damaging the submicron line.

Yet another object of the invention is to provide a method wherein a wide range of materials may be used for the submicron lines.

These and other objects of the invention will become more readily apparent from the ensuing specification when taken together with the drawings.

BRIEF DESCRIPTION OF THE DRAWINGS

FIG. 1 is a set of diagrams showing the fabrication sequence for submicron-wide lines.

FIG. 1A shows the initial preparation of the substrate;

FIG. 1B shows the shadow deposition geometry; and

FIG. 1C shows the final configuration of the submicron line.

FIG. 2 is the set of three diagrams showing the fabrication sequence for banks or electrodes of a device which uses submicron-wide lines.

FIG. 2A shows the patterning of the first bank;

FIG. 2B shows the deposition of the second bank; and

FIG. 2C shows the completed device to a reduced scale.

FIG. 3 is a pair of scanning-electron-microscope pictures of a single microbridge.

FIG. 3A shows the overall view of the device; and

FIG. 3B shows a close-up of the gap region.

FIG. 4 is a set of drawings showing the current-voltage characteristics of typical microbridges.

FIG. 4A shows a single microbridge with no applied field;

FIG. 4B shows a single microbridge with ten GHz radiation present; and

FIG. 4C shows a double device subjected to two different magnetic field intensities.

DESCRIPTION OF THE PREFERRED EMBODIMENTS

An attractive way of producing submicron features in a device is to use the "shadows" created by evaporating material at a slant angle to the vertical edges of thin films. This procedure is explained by R. H. Dean and R. J. Matarese, IEEE Trans. Electron Devices ED-22, 358(1975). This procedure allows the submicron feature dimensions to be set by the etch film thickness and the slant evaporating angle, both of which can be accurately measured. Also since irregularities in the lateral edges of the shadow are correlated one with the other, the width of the shadow is uniform even for widths less than the roughness of the filmed edge. More information on this feature may be obtained in an article written by E. C. Jelks, G. L. Kerber and H. A. Wilcox, in the Applied Physics Letters 34, 28(1979).

The techniques based on the features just described have been used to fabricate Josephson superconducting-normal-superconducting (SNS) planar microbridges with bridge lengths of 0.1 micrometer or less and bridge widths ranging from 0.15 to 0.25 micrometer. Two-junction SQUIDs have also been made with these microbridges. Reproducible fabrication of microbridges of this sort has generally been difficult in the past because of the small dimensions required.

A typical fabrication sequence is outlined in FIGS. 1 and 2. The bridge 40, FIG. 1C, is constructed first, followed by the forming of the superconducting metal electrodes or banks, 90, FIG. 2C.

Referring to the structure 10 shown in FIG. 1A, as a first step in making the bridge, a layer of aluminum 14, approximately 1,000 Å thick, is deposited on top of the substrate 12, which in this instance is SiO/Si. Next, a photoresist layer 16, such as Shipley 1350B, is spun onto the aluminum 14 and patterned. The aluminum layer 14 is now etched to undercut the photoresist 16 edge by using, for example, a mixture of two parts phosphoric acid, one part acetic acid, and one part deionized water for about ten minutes at room temperature. Chlorobenzene can also be used to achieve an undercut photoresist profile. This phase of the method is described B. J. Canavello, M. Ahatzakis, J. M. Shaw, IBM Tech. Disc. Bull. 19, 4048(1977).

A layer of aluminum 18 is now deposited at angle $\theta_1$ to the photoresist 16 edge, as shown in FIG. 1B, which defines a long submicron-wide opening to the underlying substrate 12. The desired material for the bridge can now be deposited at an angle $\theta_2$ through the submicron wide opening 22 to the underlying substrate 12. Finally, the undesired surrounding material may be removed by dissolving the photoresist 16 in hot acetone followed by stripping the remaining aluminum layers, 14 and 18, with etchant. As is shown in FIG. 1C, the final configuration 40 comprises a bridge 24 which consists of a layer of titanium 26 on top of which is a layer of gold 28.

For the last two deposition steps, it is helpful to attach the substrate 12 to a copper heat sink (not shown) using thermal grease to avoid distortion of the photoresist 16 by heating.

By the technique described hereinabove, one can fabricate metal lines from about 0.1 micrometer to about 0.3 micrometer wide using conventional photographic emulsion masks. Electrical continuity has been observed 88 percent of the time over at least 25 micrometer lengths. If an electron beam were used to expose the photoresist, it would be expected that considerably narrower and smoother lines could be generated.

The process steps used to completing microbridge device are shown in FIG. 2. As is shown in the embodiment 50 of FIG. 2A, the banks on one side, the right side, are formed with standard lift-off procedures, using Shipley 1350B photoresist 52 treated in chlorol-benzene to achieve an undercut profile. The use of a refractory superconductor such as vanadium, 54 and 56, or niobium for the banks presents some special difficulties. However, unless precautions are taken, substrate 58 heating may cause photoresist 52 distortion, and tensile strength build-up in the film during deposition may cause peeling from the substrate 58. To overcome these problems, the substrate 58 was mounted on a ¼-inch thick copper plate and thermal grease was used for good thermal contact. A radiation shield was also used. Tensile stress buildup in the films of the vanadium, 54 and 56, was compensated for by a thin (200 Å) compressive film 59 such as lead sandwiched between the thicker layers of the vanadium, 54 and 56, as pictured in FIG. 2A. No notable changes in the transition temperature $T_C$ of vanadium films, 62, 64, containing a thin intermediate layer of lead 59 have been found.

In all cases, before depositing the bank material on the bridge 62 it is necessary to sputter-clean the bridge surface to prevent contamination of the bridge-bank interface by the lithographic chemicals. Even in the case of gold bridges, failure to sputter-clean results in a series resistance of about 10 to 50 ohms at the interface. This may be due to an unwanted chemical reaction between the residual lithographic chemicals and the lower surface of the vanadium film 64.

Referring now to FIG. 2B, once the bank on one side, the left side, is formed, the other, right, bank is patterned with a lift-off process similar to the patterning of the first bank. In this case, FIG. 2B, however, the superconductor is deposited at an angle $\theta_3$ to the first, left, bank edge to form the submicron gap 72 between the banks.

The completed microbridge 90 viewed from above at reduced scale appears in FIG. 2C, where the submicron line or bridge 92 lies underneath the left and right superconducting banks, except in the shadow region 76. The process described hereinabove is suited for contructing variable thickness microbridges using either superconducting or normal metals for the bridge 92.

The single Josephson devices 90 shown in FIG. 2C and a number of double Josephson devices, not shown, have been constructed using the above described technique with the vanadium, 62, 64, 91, and gold 28 for the bridge 40, FIG. 1C. As is shown in FIGS. 1B and 1C, a 150 Å layer of titanium 26 is used for adhesion of the gold 28 to the substrate 12.

Typically, the bridges 40, FIG. 1C, and 92, FIG. 2C, have been approximately 150 Å to 250 Å thick, and 0.15 to 0.25 micrometers wide.

A scanning electron microscope (SEM) picture of a single microbridge is shown in FIG. 3A; a closeup of the bridge region appears in FIG. 3B. In FIG. 3B the underlying submicron line appears as a raised plateau running from left to right in the vanadium banks. To check for possible vanadium shorts across the gap, eight devices out of the total of 20 devices on each wafer were made with no bridges. Also, an entire wafer was fabricated with 20 devices containing no bridges. In these tests, only four out of 36 devices without bridges showed any measurable conductance and none of these four had observable critical currents.

A current-versus-voltage characteristic for a typical bridge at 2° K. is shown in FIG. 4A. For the 12 single bridges tested on three separate wafers, the static I-V characteristics were consistent with the resistively shunted junction model up to the voltage at which it appeared that heating of the banks was important. This voltage was typically about three hundred microvolts at 2° K., for example. The I-V characteristics were observed down to about $0.4T_c$(bank). More details on the resistively shunted junction model is given by K. K. Likharev, Rev. Mod. Phys. 51, 101(1979).

A step-wise pattern on the I-V characteristic produced by microwave radiation at 10 GHz (nominal) is shown in FIG. 4B. Also, quantum interference was observed in the three double junction devices which were tested. FIG. 4C shows the I-V characteristic of a double-junction device at two different applied magnetic field strengths.

The normal state resistances and critical currents at 2° K. for the twelve single devices tested were $1.71\pm0.63$ ohms and $6.37\pm4.78$ microamps, respectively. The $I_c R$ products of these SNS devices are similar to those measured by previous investigators and are more than an order of magnitude below that predicted by theory. The previous investigators are J. N. Warlaumont and R. A. Buhrman, IEEE Trans. Magn. MAG-15, 570(1979) and R. B. van Dover, R. E. Howard, and N. R. Beasley, IEEE Trans. Magn. MAG-15, 574(1979). The predicted theory is that described by Likharev, referenced hereinabove.

The geometry described herein, in which on bank is only about 700 Å thick, may result in weak superconductivity from proximity effects in the vanadium banks overlying the normal metal bridge. Thus, the geometrical model assumed in the theory may not be completely valid for the devices described herein.

It is expected that refinement of the above techniques by using electron beam exposure for the edges and increasing the bank thickness should permit variable thickness devices of excellent quality and with bridge dimensions less than 0.1 micrometer to be batch fabricated.

Obviously, many other modifications and variations of the present invention are possible in the light of the above teachings. It is therefore to be understood that within the scope of the appended claims the invention may be practiced otherwise than as specifically described.

What is claimed is:

1. A method of fabricating elongate conductive lines of submicron width on a silicon oxide-on-silicon substrate carried on a copper heatsink comprising the steps of:

depositing a first layer of aluminum to a thickness of 1000 Å upon the substrate;

spinning a photoresist layer on the aluminum layer to provide an evenly distributed photoresist layer in a prearranged pattern;

etching the aluminum layer with a mixture of two parts phosphoric acid, one part acetic acid and one part deionized water to undercut the photoresist edge;

depositing a second layer of aluminum at an angle $\theta_1$ to an edge of the photoresist layer, thereby defining an elongate submicron-wide opening to the underlying substrate;

depositing a titanium layer on the substrate and a gold layer on the titanium layer for the elongate conductive lines onto the substrate at an angle of $\theta_2$ through the elongate submicron-wide opening; and removing undesired material surrounding the elongate conductive lines by dissolving the photoresist layer in hot acetone followed by stripping the remaining portions of said first layer of aluminum and said second layer of aluminum with etchant.

* * * * *